(12) United States Patent
Steinhoff

(10) Patent No.: US 8,487,279 B2
(45) Date of Patent: Jul. 16, 2013

(54) GAS CONTAMINATION SENSOR, LITHOGRAPHIC APPARATUS, METHOD OF DETERMINING A LEVEL OF CONTAMINANT GAS AND DEVICE MANUFACTURING METHOD

(75) Inventor: Jens Arno Steinhoff, Straelen (DE)

(73) Assignee: ASML Netherlands B.V., Veldhoven (NL)

( * ) Notice: Subject to any disclaimer, the term of this patent is extended or adjusted under 35 U.S.C. 154(b) by 424 days.

(21) Appl. No.: 12/683,598

(22) Filed: Jan. 7, 2010

(65) Prior Publication Data

US 2010/0173238 A1 Jul. 8, 2010

Related U.S. Application Data

(60) Provisional application No. 61/143,338, filed on Jan. 8, 2009.

(51) Int. Cl.
*G21K 5/04* (2006.01)
(52) U.S. Cl.
USPC ............. 250/492.3; 250/492.1; 250/396 R; 250/397
(58) Field of Classification Search
USPC ............ 250/396 R, 397, 398, 492.1, 492.2, 250/492.21, 492.3
See application file for complete search history.

(56) References Cited

U.S. PATENT DOCUMENTS

| 6,670,624 | B1 * | 12/2003 | Adams et al. ............. 250/492.21 |
| 7,586,110 | B1 * | 9/2009 | Low ........................ 250/492.21 |
| 7,667,820 | B2 | 2/2010 | Kempen | |
| 2009/0231707 | A1 * | 9/2009 | Ehm et al. .................... 359/509 |

FOREIGN PATENT DOCUMENTS

| JP | 05-343030 | 12/1993 |
| JP | 06-314553 | 11/1994 |
| JP | 2000-251829 | 9/2000 |
| JP | 2000-352562 | 12/2000 |
| JP | 2007-201460 | 8/2007 |

OTHER PUBLICATIONS

English translation of Japanese Office Action for Japanese Patent Application No. 2010-000328, mailed on Dec. 26, 2011.

* cited by examiner

*Primary Examiner* — Nicole Ippolito
(74) *Attorney, Agent, or Firm* — Pillsbury Winthrop Shaw Pittman LLP

(57) ABSTRACT

A gas contamination sensor includes an ion source configured to generate a beam of ions from a sample of gas to be tested, and first and second ion detectors, each positioned to receive ions from the beam of ions that are deflected by different extents. The first ion detector is configured to receive ions generated from a primary gas in the gas being tested, and the second ion detector is configured to receive ions that are generated from the contaminant gas within the sample being tested.

14 Claims, 2 Drawing Sheets

GAS CONTAMINATION SENSOR, LITHOGRAPHIC APPARATUS, METHOD OF DETERMINING A LEVEL OF CONTAMINANT GAS AND DEVICE MANUFACTURING METHOD

CROSS-REFERENCE TO RELATED APPLICATIONS

This application claims the benefit of priority from U.S. Provisional Patent Application No. 61/143,338, filed Jan. 8, 2009, the content of which is incorporated herein by reference in its entirety.

FIELD

The present invention relates to a gas contaminant sensor, a lithographic apparatus, a method of determining a level of contaminant gas and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Within a lithographic apparatus, for example, it is desirable to ensure that contaminant levels remain below a particular level. In particular, within a lithographic apparatus using EUV radiation, contaminants containing carbon may reduce the lifetime of optical elements. This is because the carbon-containing molecules may be adsorbed onto an optical element and subsequently degrade to graphitic carbon when irradiated by EUV radiation. Such a carbon deposit decreases the reflectivity or transmissivity of the optical element.

It is therefore desirable to monitor the contaminant levels within the lithographic apparatus. Previously, it has been known to monitor contamination levels within lithography apparatus using residual gas analyzers. These are essentially mass spectrometers. However, there are some drawbacks in using residual gas analyzers for monitoring contaminant levels.

Firstly, in order to calculate a partial pressure of a contaminant, it is also necessary to provide a total pressure measurement of the gas within the lithographic apparatus. This increases the cost of the measurement system and the provision of two separate measurement devices increases the volume requirement for the measurement system, which is undesirable due to the space restrictions within a lithographic apparatus.

Furthermore, the provision of two measurement sensors means that more work is needed to calibrate the sensors and, in particular, that care must be taken to synchronize the calibration of the two sensors in order to avoid introducing additional possible errors. In addition, over the lifetime of the measurement system, the responses of the two sensors may diverge. Accordingly, repeated calibration of the measurement system may be needed.

Finally, when using a residual gas analyzer, it may be difficult to provide the required contaminant sensitivity. This is because, although the absolute sensitivity of the residual gas analyzers may be sufficient to measure a contaminant to a required partial pressure accuracy, it may only be possible in high vacuum due to a limit on the relative level of detection, namely the fraction of the total pressure that corresponds to the contaminant. Alternatively, it may only be possible using residual gas analyzers that are too expensive for practical use within a lithography apparatus and/or require a greater volume than is available within a practical lithography apparatus.

SUMMARY

It is desirable to provide an alternative system for measuring contamination levels.

According to an aspect of the invention, there is provided a gas contamination sensor, configured to determine a level of contaminant gas mixed with a primary gas, the gas contamination sensor comprising: an inlet, configured to receive a sample of a gas to be tested by the gas contamination sensor; an ion source, configured to generate a beam of ions from the sample of gas to be tested; a field generator, configured to generate a field that deflects a path of ions within the beam of ions by an amount depending on a ratio of the mass to the charge of the ion; a first ion detector, positioned such that it receives ions that are deflected by the field by a first extent and that are ions generated from the primary gas in the sample; and a second ion detector, positioned such that it receives ions that are deflected by the field by a second extent, different from the first extent, and that are ions generated from the contaminant gas in the sample.

According to an aspect of the invention, there is provided a lithographic apparatus including a gas contamination sensor as specified above, configured to determine a level of contaminant gas within at least one chamber within the lithographic apparatus.

According to an aspect of the invention, there is provided a method of determining a level of contaminant gas mixed with a process gas, the method comprising: receiving a sample of gas to be tested; generating a beam of ions from the sample of gas to be tested using an ion source; providing a field that deflects a path of ions within the beams of ions by an amount depending on the ratio of the mass to the charge of the ion; using a first ion detector to detect ions deflected by the field by a first extent and that are ions generated from the process gas; and using a second ion detector to detect ions deflected by the field by a second extent, different from the first extent, and that are ions generated from the contaminant gas.

According to an aspect of the invention, there is provided a method of determining a level of contaminant gas mixed with a process gas, the method comprising: receiving a sample of gas to be tested; generating a beam of ions from the sample of gas to be tested using an ion source; providing a field that deflects a path of ions within the beams of ions by an amount depending on a ratio of the mass to the charge of the ions;

detecting ions generated from the process gas and deflected by the field by a first extent using a first ion detector; and detecting ions generated from the contaminant gas and deflected by the field by a second extent, different from the first extent, using a second ion detector.

According to an aspect of the invention, there is provided a device manufacturing method, comprising projecting a patterned beam of radiation onto a substrate using a lithographic apparatus; wherein at least one of before, during and after the step of projecting the beam of radiation onto the substrate, the level of contaminant gas within at least one chamber of the lithographic apparatus is determined using the method specified above.

According to an aspect of the invention, there is provided a lithographic apparatus comprising: a gas contamination sensor, configured to determine a level of contaminant gas mixed with a primary gas within a chamber, the gas contamination sensor comprising an inlet, configured to receive a sample of a gas to be tested by the gas contamination sensor; an ion source, configured to generate a beam of ions from the sample of gas to be tested; a field generator, configured to generate a field that deflects a path of ions within the beam of ions by an amount depending on a ratio of the mass to the charge of the ion; a first ion detector, positioned such that it receives ions that are deflected by the field by a first extent and that are ions generated from the primary gas in the sample; and a second ion detector, positioned such that it receives ions that are deflected by the field by a second extent, different from the first extent, and that are ions generated from the contaminant gas in the sample; an illuminator configured to condition a beam of radiation; a support configured to support a patterning device, the patterning device being configured to pattern the beam of radiation; and a projection system configured to project the patterned beam of radiation onto a substrate.

According to an aspect of the invention, there is provided a device manufacturing method comprising: determining a level of contaminant gas mixed with a process gas in a lithographic apparatus, said determining comprising receiving a sample of gas to be tested, generating a beam of ions from the sample of gas to be tested using an ion source, generating a field that deflects a path of ions within the beams of ions by an amount depending on a ratio of the mass to the charge of the ion, detecting ions deflected by the field by a first extent and that are ions generated from the process gas with a first ion detector, and detecting ions deflected by the field by a second extent, different from the first extent, and that are ions generated from the contaminant gas with a second ion detector; and projecting a patterned beam of radiation onto a substrate with the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
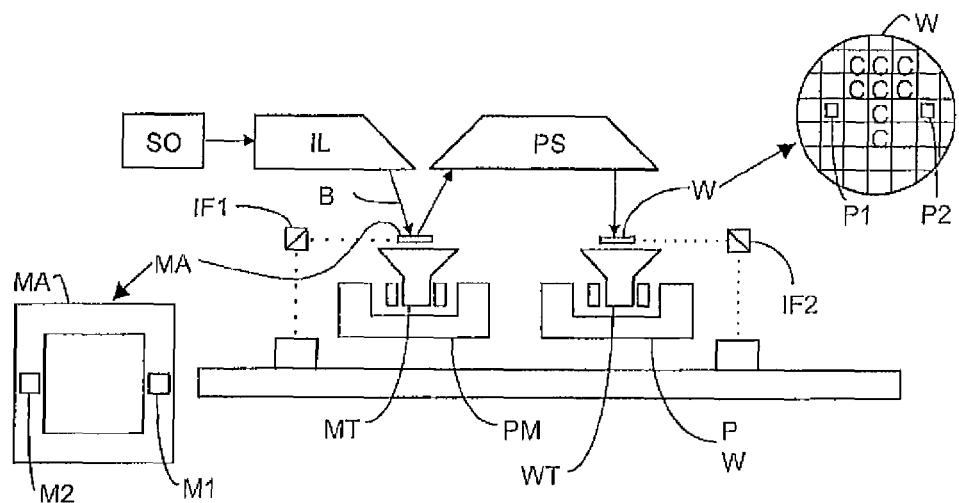
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step Mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
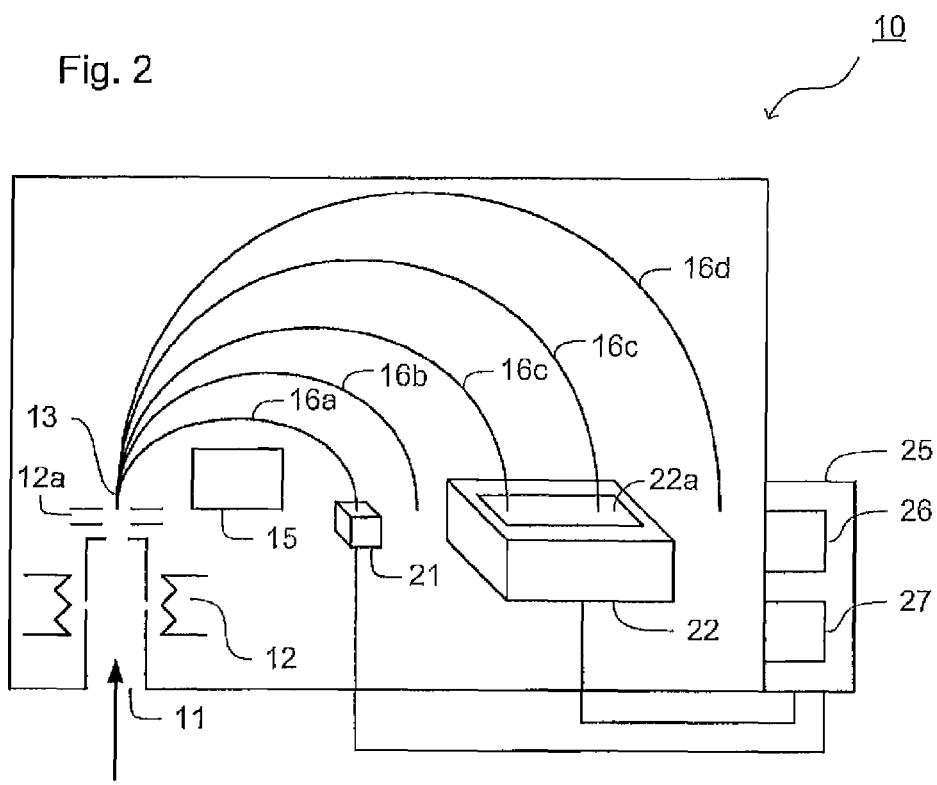
FIG. 2 depicts a gas contamination sensor according to an embodiment of the invention.

FIG. 2 depicts a gas contamination sensor 10 according to an embodiment of the present invention. As shown, the gas contamination sensor includes an inlet 11 at which a sample of the gas to be tested is received. For example, gas may be drawn from a chamber within a lithographic apparatus to the inlet 11 such that gas from the lithographic apparatus may be tested.

The gas received at the inlet 11 is passed to an ion source 12 which generates a beam of ions 13 from the gas to be tested and accelerates the ions within the ion beam to a defined energy level, for example using an electrostatic lens 12a. The ion source 12 may, in particular, be a closed ion source, which may enable its operation at a higher pressure than is possible for other ion sources. In an embodiment, the ion source 12 may be a closed electron impact ion source. However, it will be appreciated that other ion sources may also be used.

The gas contamination sensor 10 depicted in FIG. 2 further includes a magnetic field generator 15 that generates a magnetic field. For example, the magnetic field generator may be a permanent magnet or an electromagnet. The magnetic field deflects the ions in the ion beam 13. As shown, the magnetic field may deflect the ions in the ion beam 13 into curved trajectories 16a,16b,16c,16d. The extent of deflection by the magnetic field depends on the velocity of the ions produced by the ion source 12, the ratio of the mass of the ion to the charge of the ion. The more charged and faster-moving lighter ions are deflected more than the heavier ions.

The gas contamination sensor 10 further includes first and second ion detectors 21, 22. The first and second ion detectors 21, 22 are arranged such that they intersect respective trajectories of ions having particular mass-to-charge ratios. In particular, the first ion detector 21 may be arranged such that it intersects the trajectory 16a of ions from the ion beam 13 that are generated from the primary gas within the test sample, namely the intended process gas within the sample rather than a contaminant, For example, in a lithographic apparatus, the process gas may be $H_2$ at a pressure in the range of about $1 \times 10^{-2}$ mbar to about $1 \times 10^{-1}$ mbar, for example, about $3 \times 10^{-2}$ mbar.

Accordingly, the first ion detector 21 may be used, using appropriate calibration, to measure the content of the process gas within the samples to be tested. In a lithographic apparatus, it is intended that the contamination levels should be very low, for example less than about 0.1% of the total pressure. Accordingly, the determination of the content of the process gas within the gas to be tested, using the measurement from the first ion detector 21, may be used to provide a relatively accurate measurement of the total pressure of the gas received at the inlet 11, which may, for example, be the pressure of the gas within a chamber of a lithographic apparatus that is being analysed.

It should be appreciated that a variety of different ion detectors may be used as the first ion detector 21. In an embodiment, the first ion detector may be a Faraday cup. Such an ion detector is well-known and understood and may provide an accurate measurement of the ions within the ion beam 13 derived from the process gas.

The second ion detector 22 is positioned such that it intersects the trajectories 16c of ions from the ion beam 13 that are generated from the contaminant gas within the sample to be tested, once they have been deflected by the magnetic field.

In a particular arrangement, the second ion detector 22 may include an aperture 22a that is arranged such that the second ion detector 22 receives ions that have been deflected by a range of extents. Accordingly, the second ion detector 22 may be arranged to receive ions having a range of mass-to-charge ratios. Consequently, the second ion detector 22 may receive ions that are generated from contaminant molecules within the gas sample to be tested of a range of sizes. Such an arrangement may be beneficial because it may be desirable to know the total level of contamination within the gas sample for a range of molecule sizes rather than merely the level of contamination of particular molecules. Accordingly, by configuring the second ion detector 22 to detect corresponding ion species simultaneously, the speed of testing may be faster and/or the level of sensitivity to the overall contamination level may be greater.

In particular, it has been found that, within a lithographic apparatus, relatively heavy hydrocarbon molecules are particularly detrimental. This is because such relatively heavy hydrocarbon molecules may be adsorbed most readily onto the optical elements, subsequently resulting in reduction of reflectivity or transmissivity of the optical elements when the molecules degrade to graphitic carbon. Accordingly, in an embodiment, the second ion detector 22 may be specifically configured to receive ions corresponding to such molecules, such that the measurements can be used to determine the level of such molecules within the gas being tested. In particular, it has been found that configuring the second ion detector to receive ions having a unified atomic mass unit of between about 100 Da and about 200 Da provides a convenient measure of the level of contamination by relatively heavy hydrocarbon molecules.

The gas contamination sensor of the present invention is particularly intended to provide for the measurement of relatively small levels of contaminant gases. Accordingly, although the second detector 22 may be arranged, as explained above, such that it simultaneously detects ions generated from a range of sizes of molecule, the number of ions received at the second ion detector 22 may still be relatively small, Accordingly, the second ion detector 22 may be a secondary electron multiplier in order to provide sufficient sensitivity for the relatively small ion currents. However, it will be appreciated that any sufficiently sensitive ion detector may be used.

As depicted in FIG. 2, the gas contamination sensor 10 may include a controller 25, including a processor 26 and a memory 27. The memory 27 may be used to store calibration data, for example that may be obtained by providing known gas samples to the inlet 11 of the gas contamination sensor 10 and measuring the resulting signals at the ion detectors 21, 22.

Accordingly, the processor 26 may use the calibration data from the memory 27 in order to determine the pressure of the gas received at the inlet 11 using a measurement signal from the first ion detector 21. Likewise, using the calibration data, the gas pressure determined using the measurement signal from the first ion detector and a measurement from the second ion detector, the processor 26 may determine the partial pressure of the contaminant gas.

It should be appreciated that, because the gas contamination sensor includes two ion detectors within a single device which, respectively, provide measurements that may be used to determine the total gas pressure and the level of gas contamination, difficulties with the previously known methods for determining the partial pressure of the gas contaminants may be reduced. In particular, because both ion detectors may operate simultaneously, the calibration of both ion detectors 21, 22 may be performed simultaneously, using a single calibration sample for each calibration test. Accordingly, difficulties of synchronizing the calibration of two separate sensors is avoided. Furthermore, the calibration process is more efficient and accurate.

Furthermore, both ion detectors 21, 22 use the same ion source 12. Accordingly, any variation of the yield of the ion source 12 does not affect the accuracy of the measurement of the partial pressure of the gas contaminants. In contrast, in previously known systems, either the two sensors use different ion sources or only one sensor uses an ion source. Accordingly, variation of the yield of the ion source(s) may reduce the accuracy of the measurement of the partial pressure of the gas contamination. This may be particularly problematic because ion sources may suffer from aging, in which the yield changes over time, Accordingly, prior art systems may require more frequent calibration in order to reduce inaccuracies caused by the ion source(s) aging. However in the gas contamination sensor of the present invention, the aging of the ion source may not significantly affect the accuracy of the measurement of the partial pressure of the gas contamination.

Finally, by providing the two ion detectors 21, 22 within a single device, sharing a single ion source 12, the total volume of the gas contamination sensor may be minimized.

Figure 3:
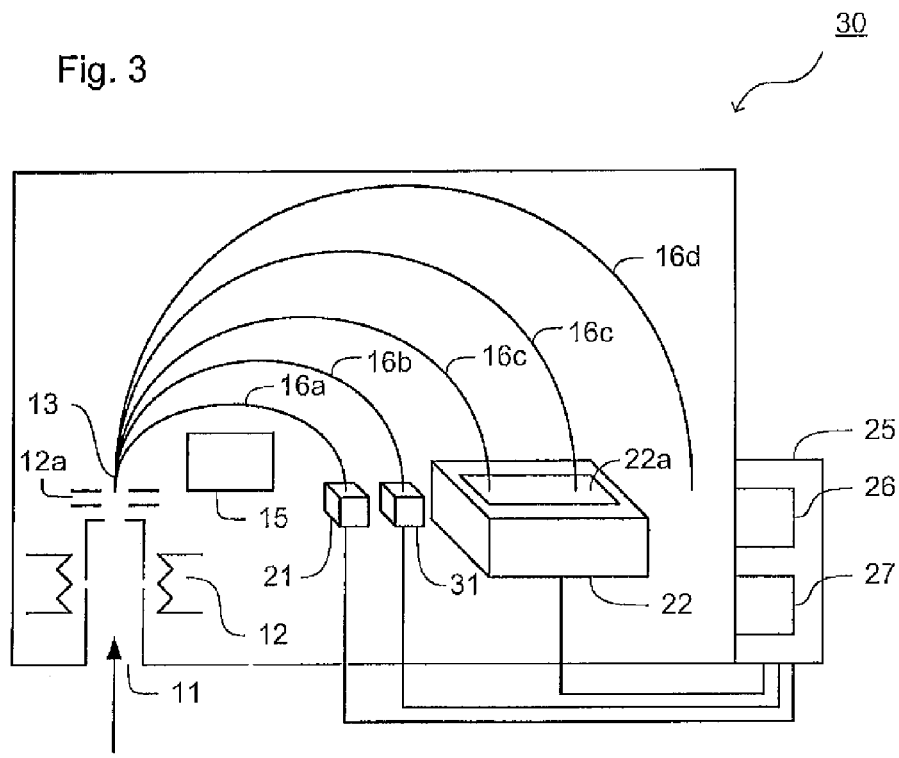
FIG. 3 depicts a gas contamination sensor according to an embodiment of the invention.

It should be appreciated that a gas contamination sensor according to the present invention may include more than two ions detectors. In particular, as shown in FIG. 3, a gas contamination sensor 30 according to an embodiment of the present invention may include three or more ion detectors 21, 22, 31. In such an arrangement, for example, the first and second ion detectors 21, 22 may be arranged to perform the same function as with the gas contamination sensor depicted in FIG. 2, namely to detect ions associated with the primary gas within the test sample and ions associated with relatively heavy hydrocarbon molecules, respectively. The third ion detector 31 may be positioned such that it intersects the trajectory 16b of ions from the ion beam 13 that are generated from a different contaminant gas. For example, the third ion detector 31 may be positioned such that it detects ions associated with any leakages of air and/or water into the process gas. It will further be appreciated that by providing a plurality of additional ion sensors, the level of a plurality of different contaminants may be determined simultaneously, Accordingly, the number of ion detectors used may be determined by the number of contaminants for which it is desirable to monitor the levels.

Furthermore, although embodiments of the present invention have been described above as being particularly beneficial for measuring contamination levels of relatively heavy hydrocarbons within a lithographic apparatus, it should be appreciated that embodiments of the invention are not limited to this use. In particular, the second ion detector 22 and, if used, the third ion detector 31 may be configured to receive ions associated with any particular contaminant for which it is desirable to measure the level.

Figure 4:
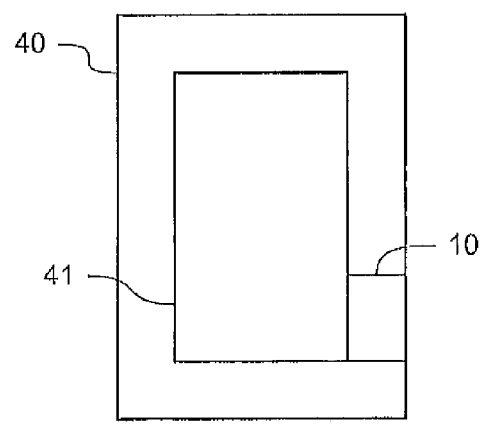
FIG. 4 depicts a lithographic apparatus including a gas contamination sensor according to an embodiment of the invention.

FIG. 4 schematically depicts a lithography apparatus 40 according to an embodiment of the present invention, As shown, the lithography apparatus 40 may include one or more chambers 41. For example, a chamber 41 may be configured to be at a relatively low pressure in order to reduce the absorption of an EUV beam of radiation used to transfer a pattern onto a substrate. Accordingly, the chamber 41 may contain some or all of the illuminator IL, the patterning device MA, the projection system PS and the substrate W. It will be appreciated, however, that some or all of these components may be provided in separate chambers. In any case, as shown, the lithography apparatus 40 may include a gas contamination sensor 10, 30, as described above, configured to determine the level of contaminant gas within the chamber 41. Accordingly, the gas contamination sensor 10, 30 may be arranged to receive a sample of gas from the chamber 41. As shown, the gas contamination sensor 10, 30 may be provided within the lithographic apparatus 40 itself.

It should be appreciated that, if the lithographic apparatus 40 includes more than one chamber 41, each chamber 41 may be provided with an associated gas contamination sensor 10, 30. Alternatively, the lithographic apparatus may only include gas contamination sensors 10, 30 for some of the chambers 41. For example, it may be sufficient to provide a gas contamination sensor for a single chamber 41 that houses the most contaminant-sensitive components or to provide a gas contamination sensor 10, 30 for the chamber 41 that most frequently becomes contaminated to a level that is detrimental to the operation of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A gas contamination sensor, configured to determine a level of contaminant gas mixed with a primary gas, the gas contamination sensor comprising:

an inlet, configured to receive a sample of a gas comprising the primary gas and the contaminant gas mixed with the primary gas to be tested by the gas contamination sensor;

an ion source, configured to generate a beam of ions from the sample of gas to be tested;

a field generator, configured to generate a field that deflects a path of ions within the beam of ions by an amount depending on a ratio of the mass to the charge of the ions;

a first ion detector, positioned to receive ions deflected by the field by a first extent and generated from the primary gas in the sample; and a second ion detector, positioned to receive ions deflected by the field by a second extent, different from the first extent, and generated from the contaminant gas in the sample, wherein the primary gas is $H_2$ gas having a pressure in a range of about $1 \times 10^{-2}$ mbar to about $1 \times 10^{-1}$ mbar.

2. A gas contamination sensor according to claim 1, wherein the second ion detector includes an aperture configured such that the second ion detector, in use, detects ions that have been deflected by the field by a range of deflections, corresponding to the ions having a range of mass-to-charge ratios.

3. A gas contamination sensor according to claim 2, wherein the aperture is configured such that the ions detected by the second ion detector, in use, are ions having a unified atomic mass unit of between about 100 Da and about 200 Da.

4. A gas contamination sensor according to claim 1, wherein the second ion detector is a secondary electron multiplier.

5. A gas contamination sensor according to claim 1, wherein the first ion detector is a Faraday cup.

6. A gas contamination sensor according to claim 1, wherein the field generator is configured to generate a magnetic field and/or an electrostatic field in order to deflect the path of ions in the beam of ions.

7. A gas contamination sensor according to claim 1, further comprising a controller including a processor and a memory, wherein calibration data is stored in the memory, and wherein the processor is configured to determine a pressure of the gas received at the inlet using a measurement signal from the first ion detector and the calibration data from the memory.

8. A gas contamination sensor according to claim 7, wherein the processor is configured to determine a partial pressure of the contaminant gas received at the inlet using a measurement signal from the second ion detector, the calibration data from the memory, and the pressure of the gas received at the inlet determined by the processor.

9. A gas contamination sensor according to claim 1, wherein the gas contamination sensor is configured such that the first and second ion detectors are operated simultaneously.

10. A gas contamination sensor according to claim 1, wherein the ion source is a closed ion source.

11. A gas contamination sensor according to claim 1, wherein the gas further comprises a second contaminant gas, and where the gas contamination sensor further comprises a third ion detector positioned to receive ions deflected by the field by a third extent, different from the first and second extents, and generated from the second contaminant gas that is mixed with the primary gas in the sample.

12. A lithographic apparatus comprising:
a gas contamination sensor, configured to determine a level of contaminant gas mixed with a primary gas within a chamber within the lithographic apparatus, wherein the primary gas is $H_2$ gas having a pressure in a range of about $1\times10^{-2}$ mbar to about $1\times10^{-1}$ mbar, the gas contamination sensor comprising
an inlet, configured to receive a sample of a gas comprising the primary gas and the contaminant gas mixed with the primary gas to be tested by the gas contamination sensor,
an ion source, configured to generate a beam of ions from the sample of gas to be tested,
a field generator, configured to generate a field that deflects a path of ions within the beam of ions by an amount depending on a ratio of the mass to the charge of the ions,
a first ion detector, positioned such that it receives ions that are deflected by the field by a first extent and that are ions generated from the primary gas in the sample; and
a second ion detector, positioned such that it receives ions that are deflected by the field by a second extent, different from the first extent, and that are ions generated from the contaminant gas in the sample;
an illuminator configured to condition a beam of radiation;
a support configured to support a patterning device, the patterning device being configured to pattern the beam of radiation; and
a projection system configured to project the patterned beam of radiation onto a substrate.

13. A method of determining a level of contaminant gas mixed with a process gas, the method comprising:
receiving a sample of gas comprising the process gas and the contaminant gas mixed with the process gas to be tested, wherein the process gas is $H_2$ gas having a pressure in a range of about $1\times10^{-2}$ mbar to about $1\times10^{-1}$ mbar;
generating a beam of ions from the sample of gas to be tested using an ion source;
providing a field that deflects a path of ions within the beams of ions by an amount depending on a ratio of the mass to the charge of the ions;
detecting ions generated from the process gas and deflected by the field by a first extent using a first ion detector; and
detecting ions generated from the contaminant gas and deflected by the field by a second extent, different from the first extent, using a second ion detector.

14. A device manufacturing method comprising:
determining a level of contaminant gas mixed with a process gas in a lithographic apparatus, said determining comprising
receiving a sample of gas comprising the process gas and the contaminant gas mixed with the process gas to be tested, wherein the process gas is $H_2$ gas having a pressure in a range of about $1\times10^{-2}$ mbar to about $1\times10^{-1}$ mbar,
generating a beam of ions from the sample of gas to be tested using an ion source,
generating a field that deflects a path of ions within the beams of ions by an amount depending on a ratio of the mass to the charge of the ions,
detecting ions deflected by the field by a first extent and that are ions generated from the process gas with a first ion detector, and
detecting ions deflected by the field by a second extent, different from the first extent, and that are ions generated from the contaminant gas with a second ion detector; and
projecting a patterned beam of radiation onto a substrate with the lithographic apparatus, wherein the determining is completed before, during, or after, or any combination of before, during, and after the projecting.

* * * * *